United States Patent [19]
Greenwood et al.

[11] Patent Number: 5,625,224
[45] Date of Patent: Apr. 29, 1997

[54] METHOD AND APPARATUS FOR AN INTEGRATED CIRCUIT CHIP CARRIER HAVING IMPROVED MOUNTING PAD DENSITY

[75] Inventors: Jonathon Greenwood, Boynton Beach, Fla.; Reed A. George, El Reno, Okla.

[73] Assignee: Motorola, Inc., Schaumburg, Ill.

[21] Appl. No.: 288,513

[22] Filed: Aug. 10, 1994

[51] Int. Cl.$^6$ ................................. H01L 23/04
[52] U.S. Cl. ..................... 257/698; 257/786; 257/723
[58] Field of Search ........................... 257/692, 698, 257/700, 774, 786, 693, 723, 724

[56] References Cited

U.S. PATENT DOCUMENTS

| | | | |
|---|---|---|---|
| 5,089,881 | 2/1992 | Panicker | 257/700 |
| 5,134,462 | 7/1992 | Freyman et al. | |
| 5,241,133 | 8/1993 | Mullen, III et al. | |
| 5,293,067 | 3/1994 | Thompson et al. | |
| 5,450,290 | 9/1995 | Boyko et al. | 257/700 |
| 5,479,319 | 12/1995 | Werther | 257/698 |
| 5,481,435 | 1/1996 | Werther | 257/698 |
| 5,481,436 | 1/1996 | Werther | 257/698 |
| 5,513,076 | 4/1996 | Werther | 257/698 |

*Primary Examiner*—Mahshid D. Saadat
*Assistant Examiner*—S. V. Clark
*Attorney, Agent, or Firm*—D. Andrew Floam

[57] ABSTRACT

An integrated circuit chip carrier (100) provides an improved mounting pad density. The chip carrier (100) includes a flexible substrate (102) with pads (104) on the top surface for interconnection with an attached integrated circuit chip (302). The chip carrier (100) further includes a mounting pad array (502) on the bottom surface having an interconnection with the pads (104), and a rigid substrate (202) having an array of holes (204) extending through it. The top surface of the rigid substrate (202) is fixedly attached to the bottom surface of the flexible substrate (102). Individual holes of the array of holes (204) correspond to and align with individual pads of the mounting pad array (502). The chip carrier (100) further includes solder (206) disposed on the mounting pad array (502) and extending through the array of holes (204) beyond the bottom surface of the rigid substrate (202) for mounting the integrated circuit chip carrier (100) to a circuit bearing substrate (700).

5 Claims, 4 Drawing Sheets

METHOD AND APPARATUS FOR AN INTEGRATED CIRCUIT CHIP CARRIER HAVING IMPROVED MOUNTING PAD DENSITY

FIELD OF THE INVENTION

This invention relates in general to integrated circuit chip carriers, and more specifically to integrated circuit chip carriers intended for micro-miniature applications.

BACKGROUND OF THE INVENTION

It is well known that there is an continuing trend towards micro-miniaturization in the electronic arts. A significant obstacle to micro-miniaturization is the size of integrated circuit (IC) chip carriers. Conventional IC chip carriers have utilized a rigid substrate for mounting the integrated circuit chip, and have been limited to a minimum line width and spacing, e.g., 4 mils (0.1016 mm) and 3 mils (0.0762 mm), respectively, for interconnect paths, based upon obtaining reasonable manufacturing yields. Rigid substrates have been further limited to a minimum diameter-plus-tolerance, e.g., 20 mils (0.508 mm), for holes drilled to provide interconnection "vias" from the top surface of the substrate to the bottom surface. These limitations in minimum line width and spacing, and in minimum space required for "vias", have limited the conventional IC chip carrier to a maximum mounting pad density characterized by a forty-five mil (1.143 mm) center-to-center spacing, or "pitch" between individual pads. This maximum mounting pad density has forced the IC chip carrier to be substantially larger than otherwise would be necessary to accommodate the IC itself without considering the mounting pad array.

Thus, what is needed is an IC chip carrier that overcomes the conventional limitations of line width and spacing, and of space required for "vias", in order to achieve a substantial increase in mounting pad density to reduce the size of the chip carrier, thereby permitting a next step in the continuing micro-miniaturization trend.

SUMMARY OF THE INVENTION

An aspect of the present invention is an integrated circuit chip carrier that provides an improved mounting pad density. The chip carrier comprises a flexible substrate having top and bottom surfaces, and a plurality of pads disposed on the top surface of the flexible substrate for interconnection with at least one integrated circuit chip attached thereto. The chip carrier further comprises a mounting pad array disposed on the bottom surface of the flexible substrate and having an interconnection lo with the plurality of pads, and a rigid substrate having an array of holes extending therethrough. The rigid substrate also has top and bottom surfaces, and the top surface of the rigid substrate is fixedly attached to the bottom surface of the flexible substrate. Locations of individual holes of the array of holes correspond to and align with locations of individual pads of the mounting pad array. The chip carrier further comprises solder disposed on the mounting pad array and extending through the array of holes beyond the bottom surface of the rigid substrate for mounting the integrated circuit chip carrier to a circuit bearing substrate.

Another aspect of the present invention is a communication receiver comprising an antenna for intercepting a signal including information, and a receiver element coupled to the antenna for demodulating the signal to derive the information. The communication receiver further comprises a processor coupled to the receiver for processing the information, and a support circuit coupled to the processor for providing miscellaneous support functions. The communication receiver also includes a circuit bearing substrate coupled to the antenna, the receiver element, the processor, and the support circuit for interconnecting the same. In addition, the communication receiver includes an integrated circuit chip carrier attached to at least one of the receiver element, the processor, and the support circuit for carrying and interconnecting the same while providing an improved mounting pad density. The integrated circuit chip carrier comprises a flexible substrate having top and bottom surfaces, and a plurality of pads disposed on the top surface of the flexible substrate and coupled to the at least one of the receiver element, the processor, and the support circuit for interconnection thereof. The chip carrier further comprises a mounting pad array disposed on the bottom surface of the flexible substrate and having an interconnection with the plurality of pads, and a rigid substrate having an array of holes extending therethrough. The rigid substrate also has top and bottom surfaces, and the top surface of the rigid substrate is fixedly attached to the bottom surface of the flexible substrate. Locations of individual holes of the array of holes correspond to and align with locations of individual pads of the mounting pad array. In addition, the chip carrier includes solder disposed on the mounting pad array and extending through the array of holes beyond the bottom surface of the rigid substrate for mounting the integrated circuit chip carrier to the circuit bearing substrate.

Another aspect of the present invention is a method of manufacturing an integrated circuit chip carrier that provides an improved mounting pad density. The method comprises the step of fabricating a flexible substrate having top and bottom surfaces, comprising the steps of disposing onto the top surface a plurality of pads for interconnection with at least one integrated circuit chip attached to the top surface, and disposing onto the bottom surface a mounting pad array having an interconnection with the plurality of pads. The method further comprises the step of fabricating a rigid substrate having top and bottom surfaces, comprising the step of forming an array of holes extending through the rigid substrate. Locations of individual holes of the array of holes correspond to locations of individual pads of the mounting pad array. The method also includes the steps of fixedly attaching the top surface of the rigid substrate to the bottom surface of the flexible substrate such that the individual holes of the array of holes align with the individual pads of the mounting pad array, and disposing solder onto the mounting pad array such that the solder extends through the array of holes beyond the bottom surface of the rigid substrate for mounting the integrated circuit chip carrier to a circuit bearing substrate.

DESCRIPTION OF THE PREFERRED EMBODIMENT

Figure 1:
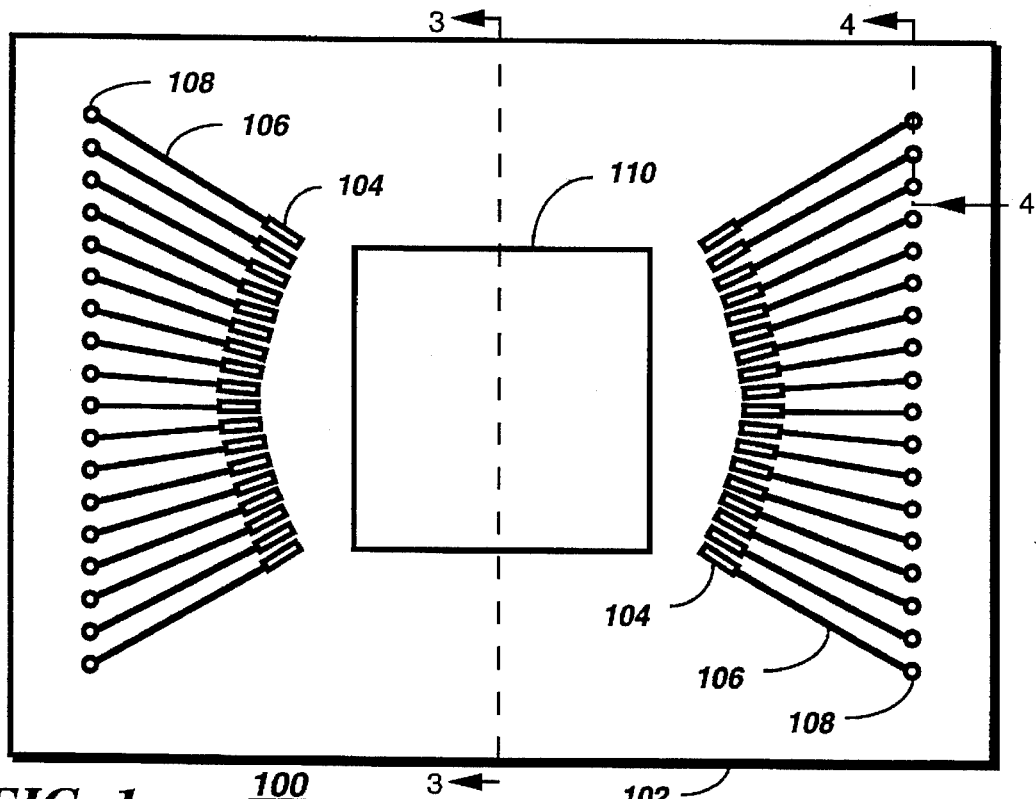
FIG. 1 is an orthogonal top view of an integrated circuit chip carrier (depicted with chip and encapsulant removed) in accordance with the preferred embodiment of the present invention.

Flexible circuit technology, i.e., circuitry and interconnections fabricated on a thin flexible substrate such as a polyimide film, is capable of achieving much finer interconnect lines and line spacing than the conventional rigid circuit technology that has been used for IC chip carriers. The finer spacing achieved is due in part to the inherently smoother surface of substrates utilizing the flexible circuit technology as compared to those utilizing the rigid circuit technology. Minimum line width and spacing compatible with reasonable manufacturing yield in today's flexible circuit technology is one mil (0.0254 mm) for both width and spacing, compared to a minimum four mil (0.1016 mm) line width and three mil (0.0762 mm) line spacing for rigid circuit technology. In addition, the "vias" necessary for interconnecting the top and bottom runners of the chip carrier can be laser drilled in flexible circuit technology, thereby allowing about a four-to-one improvement in maximum "via" density with respect to that of the mechanically drilled "vias" used in rigid circuit technology. Thus, it would seem highly desirable to use flexible circuit technology to achieve higher mounting pad density in an IC chip carrier.

Two difficulties, however, have prevented the use of flexible circuit technology for IC chip carriers prior to the present invention. The first of the difficulties is that current technology for placement of solder balls onto the mounting pad array (for future attachment to a circuit bearing substrate) is limited to about a forty mil (1.016 mm) pitch. Thus, even with the higher line and "via" densities available with flexible circuit technology, the mounting pad density is still limited by the maximum density of solder ball placement when using conventional techniques.

The second difficulty in using flexible circuit technology for an IC chip carrier is that current manufacturing processes are designed to handle rigid circuits in the fabrication and placement of IC chip carriers. Changing to flexible chip carriers would require extensive and costly modification of existing manufacturing processes for fabrication and placement. Furthermore, manufacturing products with a mix of rigid chip carriers and flexible chip carriers on the same circuit bearing substrate, e.g., a printed wiring board, would complicate handling and placement of the chip carriers.

By combining flexible circuit technology and rigid circuit technology in a novel manner that will be fully described herein below, the inventors have devised an IC chip carrier that possesses important advantages of both technologies. It will be demonstrated that the preferred embodiment of the present invention achieves a much greater mounting pad density through the finer line and "via" density available in the flexible circuit technology, while maintaining the manufacturability advantages of the rigid circuit technology. In addition, the preferred embodiment of the present invention overcomes the current limitation to maximum density of solder ball placement by providing a positive locating fixture integral to the chip carrier for more accurate solder ball placement. Preliminary evaluations have indicated that the IC chip carrier in accordance with the preferred embodiment of the present invention can reduce the "footprint" of the chip carrier by a factor of four, compared to conventional chip carrier technology.

Referring to FIG. 1, an orthogonal top view of an integrated circuit chip carrier 100 (depicted with chip and encapsulant removed) in accordance with the preferred embodiment of the present invention comprises a flexible substrate 102. Disposed on the top surface of the flexible substrate 102 are a plurality of pads 104 for interconnection with at least one integrated circuit chip, which is to be attached to the integrated circuit chip carrier 100 over a ground plane 110. A plurality of "vias" 108 are interconnected with the plurality of pads 104 by a plurality of runners 106. The plurality of "vias" 108 are for interconnecting the at least one integrated circuit chip with a mounting pad array disposed on the bottom surface of the flexible substrate 102, as will be described herein below.

An advantage provided by the utilization of the flexible substrate 102 is the ability to achieve a much higher density of the runners 106 and "vias" 108, as compared to conventional rigid circuit technology. The higher density of the runners 106 and "vias" 108 advantageously contributes to size reduction of the IC chip carrier 100.

The material utilized for the flexible substrate 102 is preferably a polyimide such as DuPont Kapton™. The thickness of the flexible substrate 102 is preferably five mils (0.127 mm). The ground plane 110, the plurality of pads 104, the plurality of "vias" 108, and the plurality of runners 106 preferably are conventional one mil (0.025.4 mm) thick copper, etched to provide the desired land areas, and then overplated with conventional thicknesses of nickel and gold. It will be appreciated that other similar materials and material thicknesses can be substituted without departing from the intent of the present invention.

While FIG. 1 (along with FIG. 6) depicts the IC chip carrier 100 as having two rows of the pads 104 on two opposite sides of the IC chip 302 for interconnecting therewith, it will be appreciated that, alternatively, the IC chip carrier 100 can comprise four rows of the pads 104 on all four sides of the IC chip 302 for interconnecting therewith, the exact arrangement being a matter of design choice and IC chip architecture.

Figure 2:
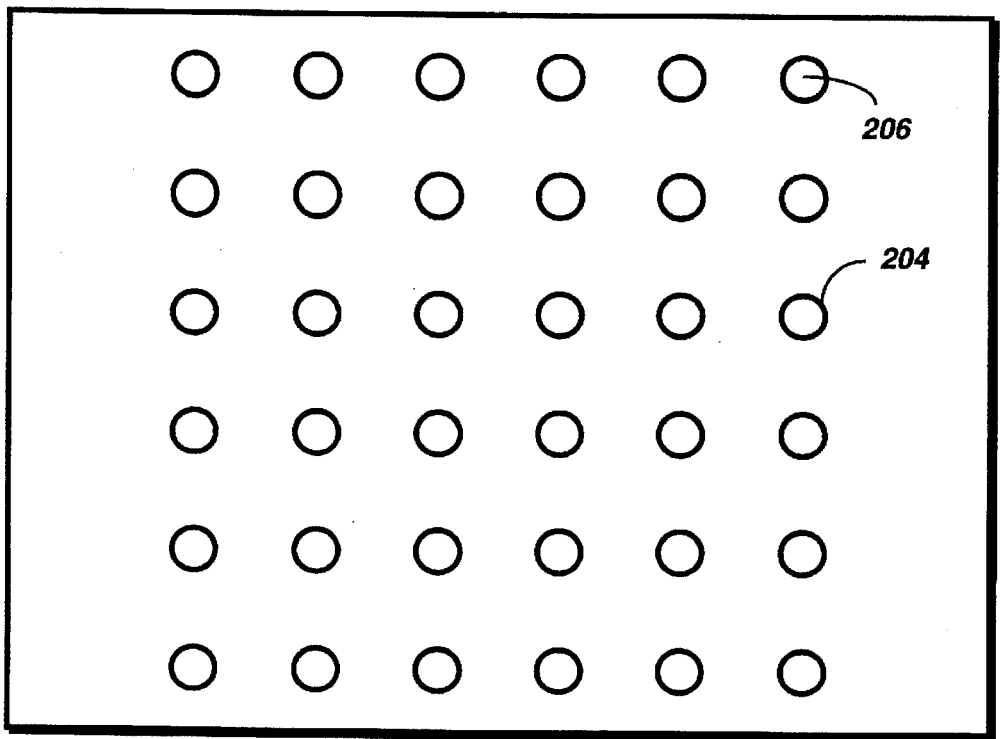
FIG. 2 is an orthogonal bottom view of the integrated circuit chip carrier in accordance with the preferred embodiment of the present invention.

Referring to FIG. 2, an orthogonal bottom view of the integrated circuit chip carrier 100 in accordance with the preferred embodiment of the present invention depicts a rigid substrate 202 having an array of holes 204 extending therethrough. Solder 206 extends through each of the array of holes 204 beyond the bottom surface of the rigid substrate 202. Preferably, the rigid substrate comprises a glass weave material impregnated with a high temperature FR-4 epoxy, the substrate having a finished thickness of ten mils (0.254 mm). Preferably, a punch is utilized to create the array of holes 204 through the rigid substrate 202, utilizing a pitch of 20 mils (0.508 mm). It will be appreciated that other similar materials, thicknesses, pitches, and tools can be used as well in fabricating the rigid substrate 202.

The array of holes 204 is punched such that each of the holes 204 aligns with a corresponding mounting pad 502 (FIG. 5) of an array of mounting pads 502 disposed on the bottom surface of the flexible substrate 102. An important advantage of the array of holes 204 during the manufacture of the IC chip carrier 100 is that the array of holes 204 can be used to facilitate placement of solder balls prior to a reflow process used to attach the solder balls to the array of mounting pads 502. By inverting the IC chip carrier 100 so that the array of holes 204 is facing upward, solder balls brushed onto the rigid substrate 202 are pushed into the holes 204, aided by gravity. Thus the array of holes 204 advantageously provides a positive locating fixture integral to the IC chip carrier 100 for more accurate solder ball placement. After a reflow heating process, the solder balls melt and attach to the array of mounting pads 502 as the solder 206 depicted in FIG. 2.

Figure 3:
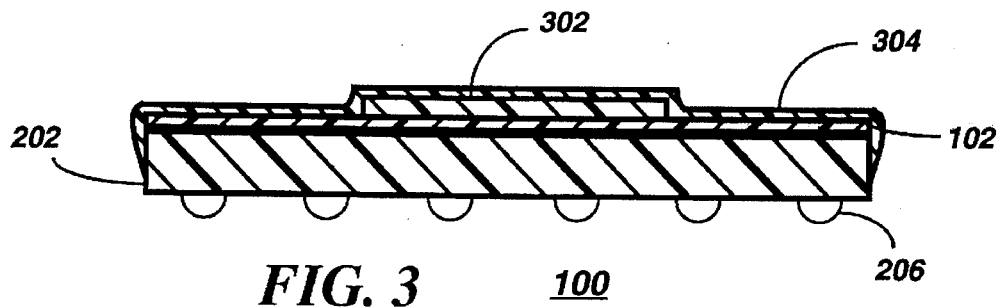
FIG. 3 is an orthogonal cross-section view (vertical dimension exaggerated) of the integrated circuit chip carrier depicting the chip and encapsulant in accordance with the preferred embodiment of the present invention.

Referring to FIG. 3, an orthogonal cross-section view taken along the line 3—3 of FIG. I (vertical dimension exaggerated) of the integrated circuit chip carrier 100 depicts the IC chip 302 and encapsulant 304 in accordance with the preferred embodiment of the present invention. Also shown in FIG. 3 is the flexible substrate 102, which is laminated to the rigid substrate 202. In addition, the solder 206 is depicted extending through the array of holes 204 beyond the bottom surface of the rigid substrate 202.

Figure 4:
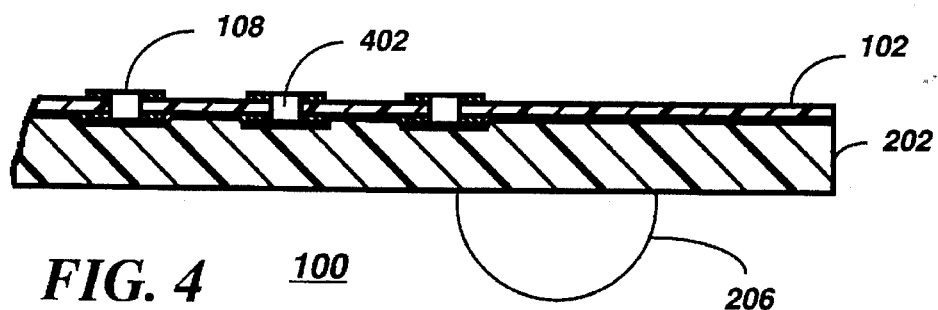
FIG. 4 is an orthogonal cross-section view (vertical dimension exaggerated) of a portion of the integrated circuit chip carrier depicting "vias" in accordance with the preferred embodiment of the present invention.

Referring to FIG. 4, an orthogonal cross-section view taken along the line 4—4 of FIG. 1 (vertical dimension exaggerated) of a portion of the integrated circuit chip carrier 100 depicts the "vias" 108 in accordance with the preferred embodiment of the present invention. The view of FIG. 4 also depicts an interconnection cylinder 402 plated through each "via" 108 for electrically interconnecting the IC chip 302 on the top surface of the flexible substrate 102 with the array of mounting pads 502 on the bottom surface of the flexible substrate 102.

Figure 5:
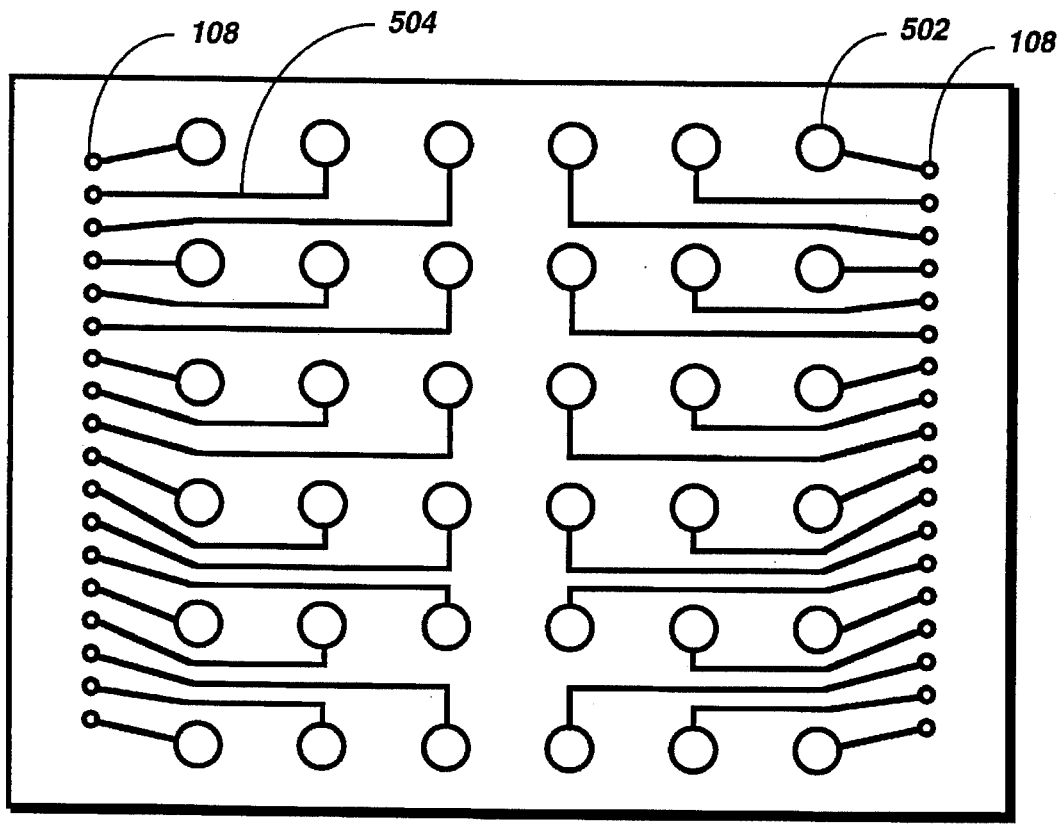
FIG. 5 is an orthogonal bottom view of a flexible substrate in accordance with the preferred embodiment of the present invention.

Referring to FIG. 5, an orthogonal bottom view of the flexible substrate 102 in accordance with the preferred embodiment of the present invention depicts runners 504 for interconnecting the "vias" 108 with the array of mounting pads 502. Because multiple ones of the runners 504 must pass between the individual pads 502 of the array of mounting pads 502, it is important that the line width and spacing of the runners 504 be minimized in order to achieve maximum density of the array of mounting pads 502. As described herein above, the flexible circuit technology utilized in the preferred embodiment of the present invention advantageously minimizes the line width and spacing to maximize the density of the mounting pads 502.

Figure 6:
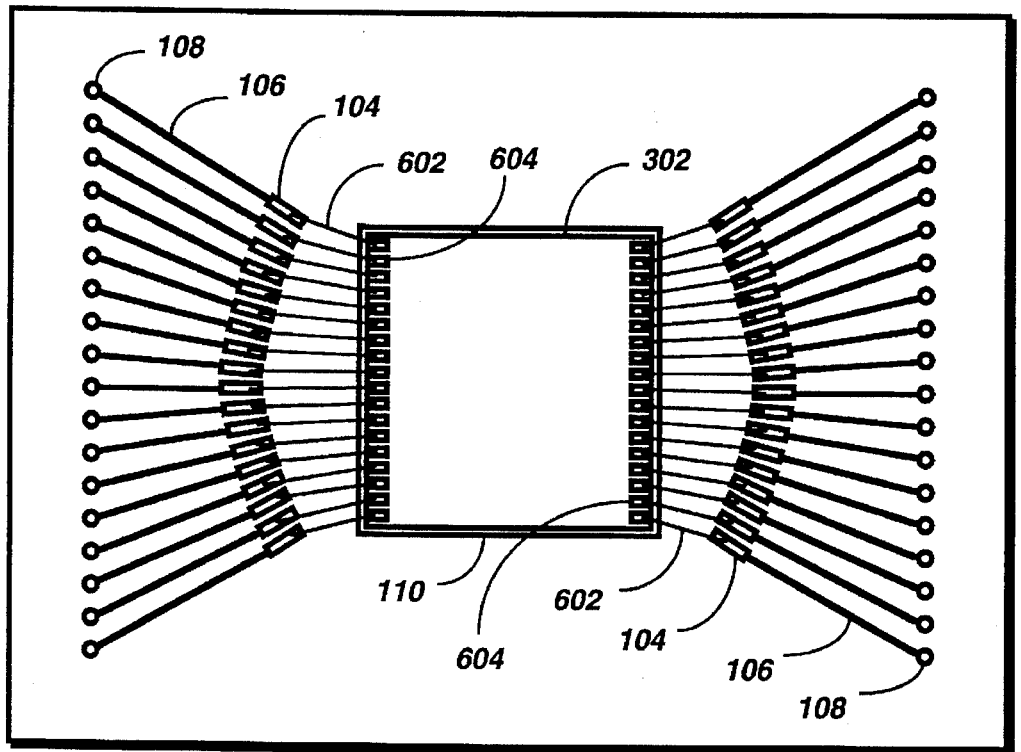
FIG. 6 is an orthogonal top view of the integrated circuit chip carrier (encapsulant removed) depicting the chip wire bonded to the flexible substrate in accordance with the preferred embodiment of the present invention.

Referring to FIG. 6, an orthogonal top view of the integrated circuit chip carrier 100 (encapsulant 304 removed) depicts the IC chip 302 wire bonded to the flexible substrate 102 in accordance with the preferred embodiment of the present invention. Wire bonds 602 extend from a plurality of contact pads 604 of the IC chip 302 to the plurality of pads 104 on the flexible substrate 102 for interconnection therewith. Note also that the IC chip 302 is centered over the ground plane 110 after being mounted to the IC chip carrier 100.

Figure 7:
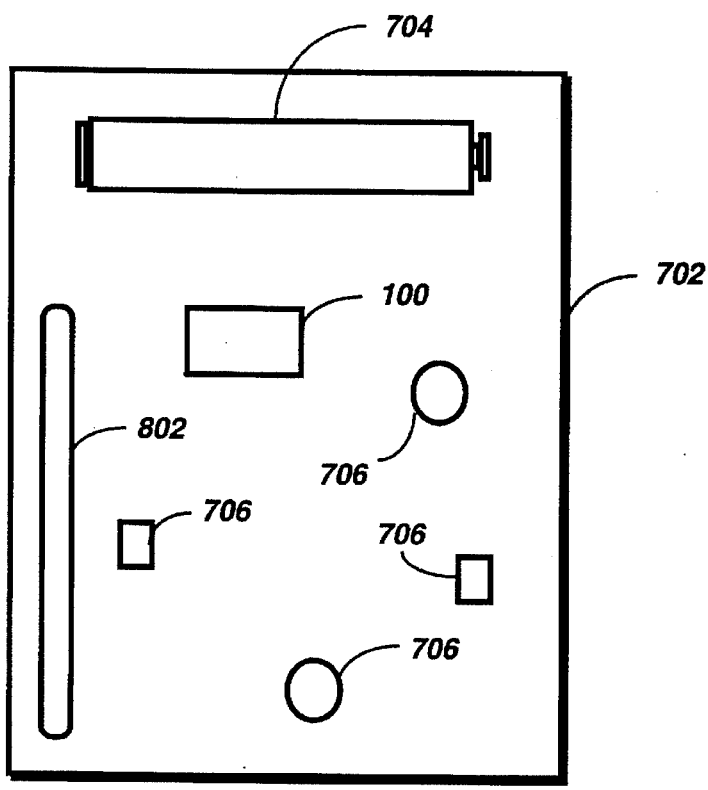
FIG. 7 is an orthogonal top view of a circuit bearing substrate of a communication receiver in accordance with the preferred embodiment of the present invention.
Figure 8:
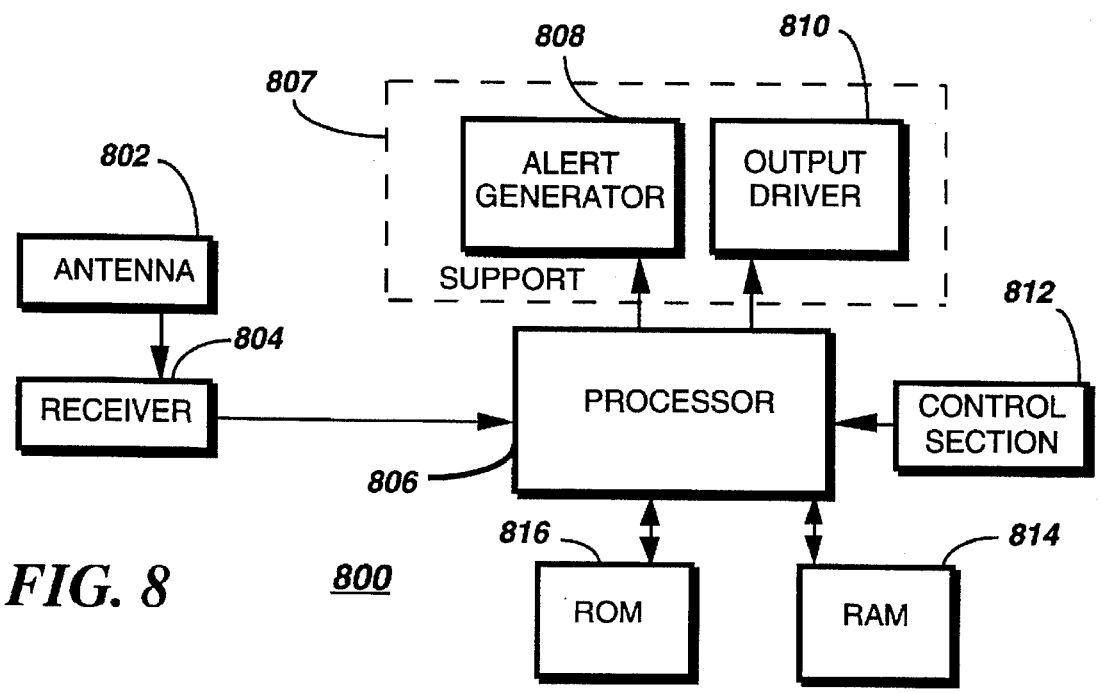
FIG. 8 is an electrical block diagram of the communication receiver in accordance with the preferred embodiment of the present invention.

Referring to FIG. 7, an orthogonal top view of a circuit bearing substrate 700 of a communication receiver 800 (FIG. 8) in accordance with the preferred embodiment of the present invention depicts a printed wiring board 702. Mounted on the printed wiring board 702 are a battery 704 for providing power to the communication receiver 800, and the IC chip carrier 100 in accordance with the preferred embodiment of the present invention, comprising support circuitry 807 (FIG. 8). Also depicted are a conventional antenna 802 for intercepting communication signals, and other elements 706 forming the communication receiver 800, as will be further described in FIG. 8. It will be appreciated that in an alternative embodiment the IC chip carrier 100 can comprise the processor 806, the ROM 816, the RAM 814, and the receiver 804 (FIG. 8) in any combination, with or without the support circuitry 807, as well.

Referring to FIG. 8, an electrical block diagram of the communication receiver 800 in accordance with the preferred embodiment of the present invention depicts the antenna 802 for intercepting communication signals including information. A receiver element 804 is coupled to the antenna 802 for demodulating the communication signals to derive the information. The receiver element 804 is preferably similar to the receiver element of the model A03KLB5962CA ADVISOR® pager, manufactured by Motorola, Inc. of Schaumburg, Ill. A processor 806 is coupled to the receiver element 804 for processing the information. Preferably, the processor 806 is similar to the MC68HC05, C08, or C11 series microcomputer manufactured by Motorola, Inc. of Schaumburg, Ill. The support circuitry 807 comprises an alert generator 808 for generating an alert through, for example, a conventional piezoelectric transducer. The alert generator 808 is coupled to the processor 806 for generating the alert responsive to the information received. An output driver 810, for driving, for example, a well-known liquid crystal display or a speaker, is coupled to the processor 806 for visibly or audibly reproducing the information received. A control section 812, comprising well-known knobs, switches, and buttons, is coupled to the processor 806 for allowing a user to control the communication receiver 800. A conventional random access memory (RAM) 814 is coupled to the processor 806 for storing the information received. A conventional read-only memory (ROM) 816 is also coupled to the processor 806 for storing operating software and other necessary parameters.

It will be appreciated that other types of ROM, e.g., electrically erasable programmable ROM (EEPROM) and electrically alterable ROM (EAROM), can be utilized as well for the ROM 816, and further that the processor 806, the ROM 816, and the RAM 814 can be fabricated as a contiguous integrated circuit in an alternative embodiment in accordance with the present invention.

Figure 9:
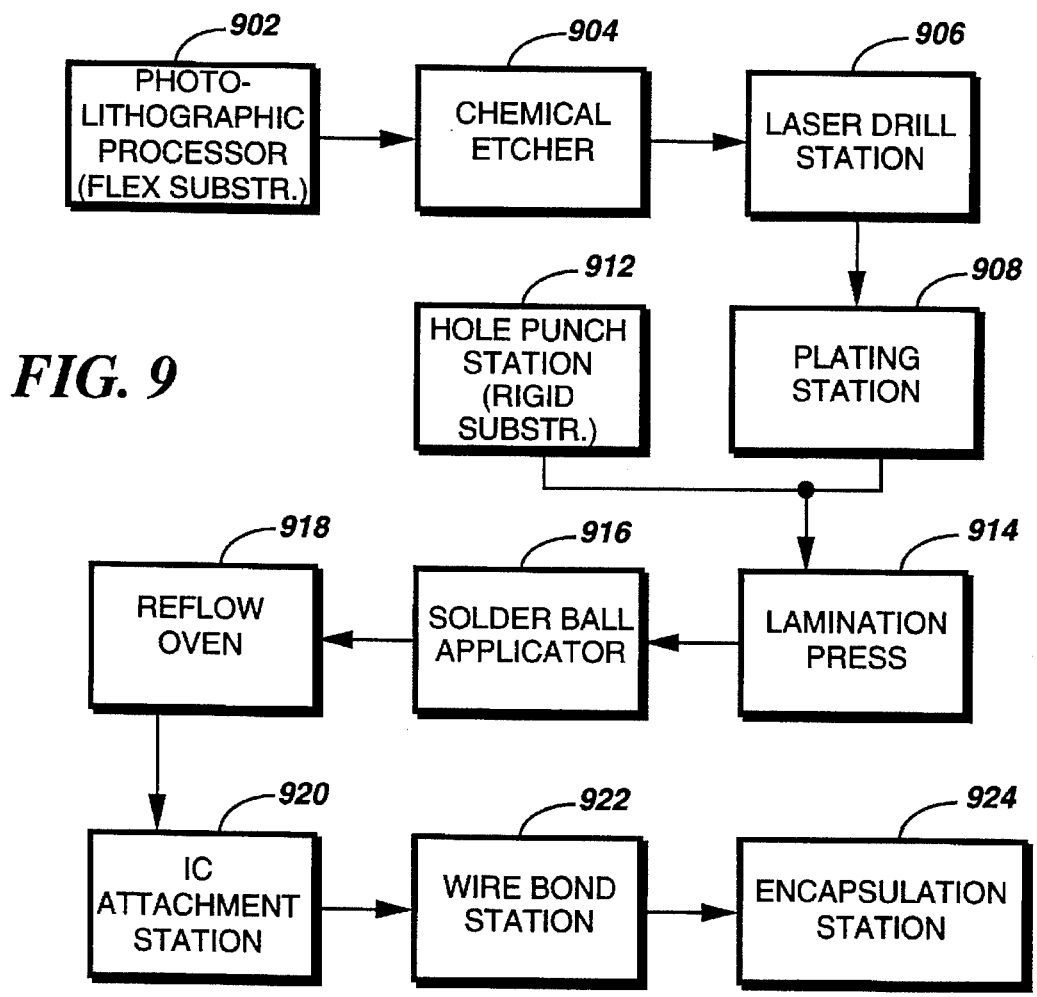
FIG. 9 is a process flow chart of a method of manufacturing the integrated circuit chip carrier in accordance with the preferred embodiment of the present invention.

Referring to FIG. 9, a process flow chart depicts a method of manufacturing the integrated circuit chip carrier in accordance with the preferred embodiment of the present invention. The method begins with the copper-clad flexible substrate 102 being processed photolithographically 902 and then chemically etched 904 to leave the runners 106, the pads 104, the "vias" 108, the runners 504, and the mounting pads 502 thereon. Next, the flexible substrate 102 is laser drilled 906 to provide an opening for the interconnection cylinders 402 through each "via". After laser drilling, the flexible substrate 102 is plated 908 with copper to create the interconnection cylinders 402. In addition all copper remaining on the flexible substrate 102 is plated with nickel and then gold, preferably to a thickness of about three microns and one micron, respectively.

Meanwhile, the rigid substrate 202, preferably partially cured to a no-flow state, is punched 912 to form the array of holes 204. Then both the rigid substrate 202 and the flexible substrate 102 are placed into a lamination press 914, wherein the top surface of the rigid substrate 202 is touching the bottom surface of the flexible substrate 102, and wherein the array of holes 204 is aligned with the array of mounting pads 502. While being pressed together, the rigid substrate 202 and the flexible substrate 102 are heated to complete the curing of the rigid substrate 202 and to securely bond the flexible substrate 102 thereto to form the IC chip carrier 100.

Next, the chip carrier 100 is inverted, and solder balls, preferably 10 mils (0.254 mm) in diameter, are applied 916 to the inverted chip carrier 100, where the solder balls fit into the array of holes 204, which acts as a fixture for accurately positioning the solder balls over the array of mounting pads 502. The IC chip carrier 100 then is heated in a reflow oven 918 to liquefy the solder balls, thereby attaching the solder to the array of mounting pads 502.

The chip carrier 100 next passes to an IC attachment station 920, where the IC chip 302 is attached above the ground plane 110, preferably utilizing a conventional silver filled epoxy to bond the IC chip 302 and the ground plane 110 together. Then the chip carrier 100 moves to a wire bond station 922, where the plurality of contact pads 604 of the IC chip 302 are interconnected with the plurality of pads 104 on the flexible substrate 102 by the wire bonds 602.

As a final step in the manufacturing process, the chip carrier 100 is encapsulated 924 with a conventional epoxy based encapsulant applied over the IC chip 302 and over the wire bonds 602 to insulate and protect the IC chip 302 and the wire bonds 602.

The manufacturing tools and workstations utilized in the method of manufacture depicted in FIG. 9 are conventional and can be constructed from components available off-the-shelf. It will be appreciated that other similar tools and workstations can be substituted for those depicted without departing from the intent of the present invention.

In summary, the present invention advantageously includes a method and apparatus for providing an IC chip carrier that overcomes the conventional limitations of line width and spacing, and of space required for "vias", in order to achieve a substantial increase in mounting pad density and to reduce the size of the chip carrier. In addition there is provided a positive locating fixture integral to the chip carrier to provide the more accurate solder ball placement needed for a higher density mounting pad array. As described in detail herein above, the present invention advantageously enables a significant reduction in the size of the IC chip carrier in accordance therewith, compared to the conventional IC chip carrier.

What is claimed is:

1. A communication receiver comprising:

an antenna for intercepting a signal including information;

a receiver element coupled to the antenna for demodulating the signal to derive the information;

a processor coupled to the receiver for processing the information;

a support circuit coupled to the processor for providing miscellaneous support functions;

a circuit bearing substrate coupled to the antenna, the receiver element, the processor, and the support circuit for interconnecting the same; and an integrated circuit chip carrier attached to at least one of the receiver element, the processor, and the support circuit for carrying and interconnecting the same while providing an improved mounting pad density, the integrated circuit chip carrier comprising:

a flexible substrate having top and bottom surfaces;

a plurality of pads disposed on the top surface of the flexible substrate and coupled to the at least one of the receiver element, the processor, and the support circuit for interconnection thereof;

a mounting pad array disposed on the bottom surface of the flexible substrate and having an interconnection with said plurality of pads;

a rigid substrate having an array of holes extending therethrough, the rigid substrate also having top and bottom surfaces, wherein the top surface of the rigid substrate is fixedly attached to the bottom surface of the flexible substrate, and wherein locations of individual holes of said array of holes correspond to and align with locations of individual pads of said mounting pad array; and solder disposed on said mounting pad array and extending through said array of holes beyond the bottom surface of the rigid substrate for mounting the integrated circuit chip carrier to the circuit bearing substrate.

2. The communication receiver of claim 1, wherein the flexible substrate comprises a polyimide material, laser drilled to accommodate the interconnection between said mounting pad array and said plurality of pads.

3. The communication receiver of claim 1, wherein the rigid substrate comprises a high temperature FR-4 epoxy material, punched to provide said array of holes.

4. The communication receiver of claim 1, further comprising:

a plurality of wire bonds attached between the at least one of the receiver element, the processor, and the support circuit and said plurality of pads for interconnecting the at least one of the receiver element, the processor, and the support circuit with said plurality of pads.

5. The communication receiver of claim 4, further comprising an encapsulating material applied over the at least one of the receiver element, the processor, and the support circuit and over the plurality of wire bonds for insulating and protecting the same.

* * * * *